United States Patent [19]

Guillou et al.

[11] Patent Number: 4,853,656

[45] Date of Patent: Aug. 1, 1989

[54] DEVICE FOR CONNECTING TOGETHER TWO ULTRA-HIGH FREQUENCY STRUCTURES WHICH ARE COAXIAL AND OF DIFFERENT DIAMETERS

[75] Inventors: Bernard P. Y. Guillou, Aubin du Medoc; Pierre V. A. Lahitte, Salaunes, both of France

[73] Assignee: Aerospatiale Societe Nationale Industrielle, Bld DeMontmorency, France

[21] Appl. No.: 225,784

[22] Filed: Jul. 29, 1988

[30] Foreign Application Priority Data

Aug. 3, 1987 [FR] France ............................ 87 11010

[51] Int. Cl.[4] .......................... H03H 7/38; H01P 5/103

[52] U.S. Cl. .......................................... 333/34; 333/33; 333/260

[58] Field of Search .................... 333/33, 34, 260, 244

[56] References Cited

U.S. PATENT DOCUMENTS

| | | | |
|---|---|---|---|
| 1,841,473 | 1/1932 | Green | 333/34 |
| 1,932,448 | 10/1933 | Clavier | 333/34 |
| 1,937,652 | 12/1933 | Green | 333/34 |
| 2,453,759 | 11/1948 | Robinson | 333/34 |
| 2,533,239 | 12/1950 | Gent et al. | 333/34 |
| 2,776,368 | 1/1957 | Owren et al. | 333/34 |
| 3,146,414 | 8/1964 | Marcatili | 333/34 |
| 3,506,935 | 4/1970 | Minich | 333/34 |
| 4,456,894 | 6/1984 | Lapart | 333/22 R |

FOREIGN PATENT DOCUMENTS

| | | | |
|---|---|---|---|
| 0092137 | 3/1983 | European Pat. Off. . | |
| 0879562 | 4/1953 | Fed. Rep. of Germany . | |
| 1020389 | 2/1957 | Fed. Rep. of Germany . | |
| 1122116 | 1/1962 | Fed. Rep. of Germany | 333/33 |
| 0058156 | 9/1953 | France . | |
| 0576147 | 3/1946 | United Kingdom . | |

OTHER PUBLICATIONS

N. Marcuvitz, "Waveguide Handbook", (1951), pp. 96 to 100, McGraw-Hill Book, New York.

*Primary Examiner*—Eugene R. LaRoche
*Assistant Examiner*—Seung Ham
*Attorney, Agent, or Firm*—Fisher, Christen & Sabol

[57] ABSTRACT

A device is provided for connecting together two coaxial ultra-high frequency structures of different diameters. This device is remarkable in that it has itself a rigid coaxial structure comprising a central core in the form of a truncated cone, as well as a peripheral sheath whose internal wall is a truncated cone shaped surface, the small bases of the truncated cones of said central core and of said peripheral sheath of said connection are two parallels of the same sphere centered on the apex of the truncated cone shaped surface of said internal wall and the large bases of the truncated cones of said central core and said peripheral sheath of said connection are two parallels of a second sphere concentric to the first one.

11 Claims, 1 Drawing Sheet

DEVICE FOR CONNECTING TOGETHER TWO ULTRA-HIGH FREQUENCY STRUCTURES WHICH ARE COAXIAL AND OF DIFFERENT DIAMETERS

BACKGROUND OF THE INVENTION

The present invention relates to a device for connecting together two ultra-high frequency structures, of coaxial type but of different diameters.

Coaxial lines and their connecting accessories are standardized as regards their dimensions. Thus, it is easy to fit together elements belonging to the same dimensional standard. However, it would sometimes be desirable to be able to construct ultra-high frequency assemblies comprising coaxial elements of different diameters, some of them not necessarily being standardized. For example, in a patent application filed concurrently herewith in the name of the Applicant and entitled : "Procédé et dispositif pour l'estimation des caractéristiques électromagnétiques d'un matériau diélectrique ou magnétique" ("Method and device for estimating the electromagnetic characteristics of a dielectric or magnetic material"), a rigid coaxial line is described having a relatively large diameter so as to be able to contain a significant sample of the material. Such a coaxial line may have a diameter of 50 mm. Moreover, it is advantageous to make the connections of such a large diameter coaxial line by means of smaller and standardized diameter connections, for example of 7 mm.

Thus, it is an object of the present invention to provide a device for connecting together two ultra-high frequency structures, which are coaxial and of different diameters without disturbing the propagation of the ultra-high frequency waves.

SUMMARY OF THE INVENTION

For this, in accordance with the present invention, the device for connecting together two ultra-high frequency structures, which are coaxial but of different diameters, each formed of a central core and a peripheral sheath, is remarkable in that it has itself a rigid coaxial structure comprising a central core in the shape of a truncated cone, whose circular bases have sections respectively identical to those of the central cores of said coaxial structures to be connected together, as well as a peripheral sheath, whose internal wall is a truncated cone shaped surface, whose circular bases have sections respectively identical to the internal sections of the peripheral sheaths of said coaxial structures to be connected together, in that the small bases of the truncated cones of said central core and of said peripheral sheath of said connection are two parallels of a first sphere centered on the apex of the truncated cone surface of said internal wall and in that the large bases of the truncated cones of said central core and of said peripheral sheath of said connection are two parallels of a second sphere concentric to the first one.

The Applicant has in fact discovered that if the connecting device satisfies the above conditions, the propagation of the electromagnetic waves, from one coaxial structure to the other, takes place under optimum conditions.

Preferably, the angle at the apex of said truncated cone shaped surface of the internal wall of the peripheral sheath of said connection is at most equal to 15°. In fact, the transition between the two coaxial structures is then particularly progressive, so that the electromagnetic waves undergo few disturbances.

Advantageously, the truncated cone of the central core of said device is extended, on each side, by cylindrical core portions with sections respectively identical to the internal sections of the sheaths of said structures to be connected together.

In one advantageous embodiment of the device of the present invention, the central core of said connection device is fixed to the sheath by means of annular spacers. In this case, it is advantageous for these spacers to be disposed in the cylindrical extensions of said core and said peripheral sheath. At least one of these spacers may be housed, at its internal and/or external peripheries, in facing grooves, formed respectively in said core and/or in said peripheral sheath. It is then advantageous for such a spacer to be disposed in the vicinity of one end of said connection device, for said groove to be defined between a face of said peripheral sheath and an end-piece able to be assembled to said body and for said core to be made from at least two interlockable portions.

BRIEF DESCRIPTION OF THE DRAWINGS

The figures of the accompanying drawings will better show how the present invention may be constructed. In these figures, identical references designate identical elements.

DESCRIPTION OF THE PREFERRED EMBODIMENT

Figure 1:
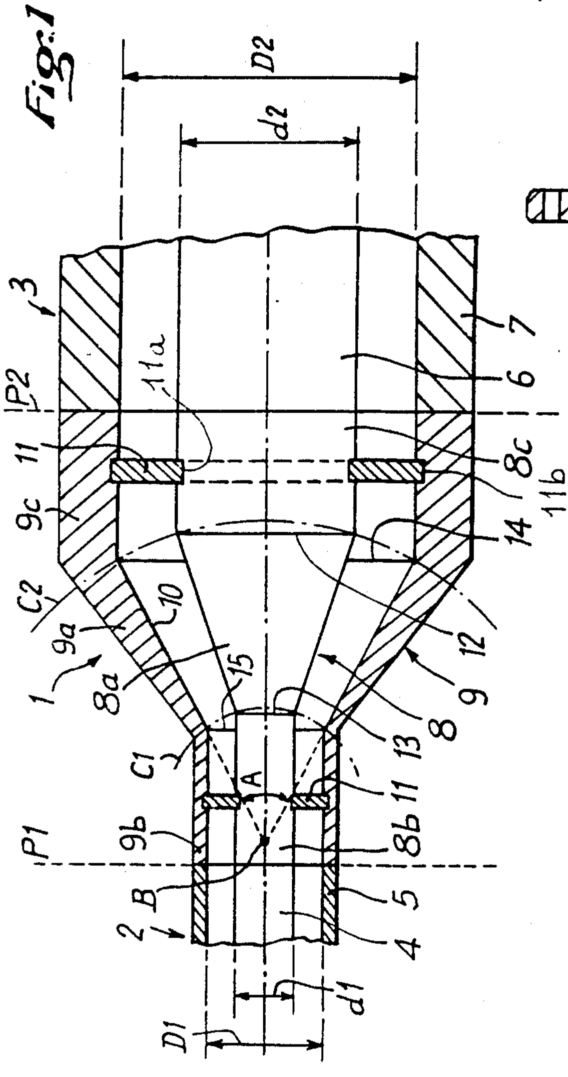
FIG. 1 is a diagrammatic view, in axial section, illustrating the connection of the present invention.

The connection 1, shown schematically in FIG. 1, is for connecting together two coaxial ultra-high frequency structures, e.g. lines 2 and 3 of different diameters.

The coaxial line 2, of smaller diameter, comprises a central cylindrical core 4, of diameter d1 and a peripheral cylindrical sheath 5 with an internal diameter D1. Similarly, the coaxial line 3, of larger diameter, comprises a central cylindrical core 6, of diameter d2, and a peripheral cylindrical sheath 7, of internal diameter D2.

The electric and mechanical connections of connector 1 with respectively the coaxial lines 2 and 3 are assumed to be formed in planes P1 and P2, using means not shown, which may have any known structure.

Connection 1 also has a coaxial structure, with a central core 8 and a peripheral sheath 9. When the connection 1 joins together the coaxial lines 2 and 3, these three elements are coaxial, at least in the vicinity of said connection 1. Annular spacers 11 secure core 8 to sheath 9.

The central core of connection 1 has a truncated cone shaped part 8*a* whose end bases 12 and 13 have respectively diameters equal to d1 and d2. This truncated cone shaped part 8*a* is extended, towards the coaxial line 3, by a cylindrical end portion 8*c*, with diameter equal to d2, for connection to core 6.

The peripheral sheath 9 of connection 1 also has a truncated cone shaped part 9*a* extended on each side by portions 9*b* and 9*c*, respectively for connection to the peripheral sheaths 5 and 7. The internal wall 10 of the truncated cone shaped portion 9*a* of sheath 9 is a truncated cone surface and its angle at apex A is at most equal to 15°. Since the arrangement of the connection is coaxial, apex B of the conical surface 10 is situated on the axis of said connection 1. The diameters of bases 14 and 15 of the internal wall 10 are respectively equal to D2 and D1.

In accordance with the essential feature of the present invention, the small bases 13 and 15, respectively of the core portion 8*a* and of the internal wall 10, are parallels of a first sphere C1 centered at B, whereas the large bases 12 and 14, respectively of said core portion 8*a* and of said internal wall 10, are parallels of a second sphere C2 also centered at B. Under these conditions, an electromagnetic wave passes with a minimum of disturbance from line 2 to line 3 and vice versa.

As can be seen, the spaces 11 interlocking the core 8 and the peripheral sheath 9 are situated opposite cylindrical portions 8*b*, 9*b* and 8*c*, 9*c* thereof and are engaged in grooves 11*a*, 11*b* formed in the surface of said portions.

Figure 2:
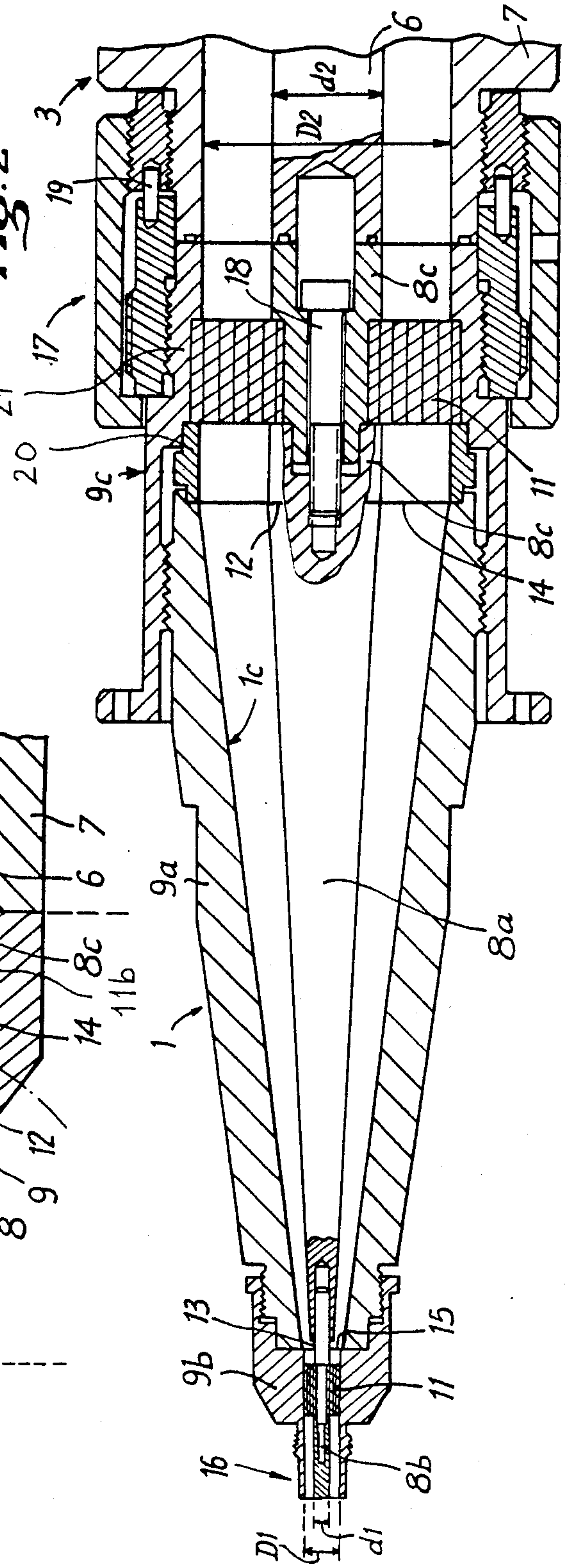
FIG. 2 shows, also in axial section, one embodiment of the connection in accordance with the present invention.

In FIG. 2, a practical embodiment has been shown of the connection device of the present invention. In this embodiment, screw connecting means 16 and 17 are provided for respectively connecting the connection device 1 mechanically and electrically to the line, or structure, 2 (not shown) and to the line or structure 3.

The connection means 16 are formed by a screwed end-piece forming in addition the cylindrical portion 9*b* of sheath 9, and intended for connecting core 8 to core 4 and sheath 9 to sheath 5. The connecting means 17 comprise an anchor nut for pressing the corresponding ends of cores 8 and 6 and sheaths 7 and 9 one against the other. To provide electric contacts between said cores or said sheaths, reciprocally, it is possible to use known conducting seals, or else the system described in the French patent application filed concurrently herewith by the Applicant and entitled :"Système de liaison à joint pour élements travaillant en hyperfrequence" ("Seal connecting means for elements working at ultra-high frequencies").

The cylindrical portion 9*c* is formed partially by a ring 20 secured by screwing to the conical portion 9*a*. Spacer 11, located on the smallest diameter side, is disposed in a groove in portion 8*b*, but is force fitted in the cylindrical portion 9*b*. Spacer 11, located on the largest diameter side, is disposed in such a groove and in portion 8*c* and in a groove of portion 9*c*. For this, portion 8*c* is formed of two parts assembled together by screws 18, whereas the cylindrical portion 9*c* comprises, in addition to plate 20, a screwable end-piece 21 so that the spacer 11 may be pressed against ring 20 and end-piece 21.

Guide and centering means 19 are associated with the connection means 17.

What is claimed is:

1. A tapered, coaxial device for connecting together two ultra-high frequency coaxial structures of different diameters, each of said coaxial structures being formed of a central core and a peripheral sheath, said tapered, coaxial device comprising a central core in the shape of a truncated cone, whose circular bases have sections respectively identical to those of the central cores of said coaxial structures to be connected together, as well as a peripheral sheath, whose internal wall is a truncated cone shaped surface, whose circular bases have sections respectively identical to the internal sections of the peripheral sheaths of said coaxial structures to be connected together, wherein the small bases of the truncated cones of said central core and of said peripheral sheath are two parallels of the same sphere centered on the apex of the truncated cone surface of said internal wall and the large bases of the truncated cones of said central core and of said peripheral sheath are two parallels of a second sphere concentric to the first one.

2. The device as claimed in claim 1, wherein the angle at the apex of said truncated cone shaped surface of the internal wall of the peripheral sheath of said connection is at most equal to 15°.

3. The device as claimed in claim 1, wherein the truncated cone of the central core of said device is extended, on each side, by cylindrical core portions with sections respectively identical to those of the cores of said coaxial structures to be connected together, whereas said internal truncated cone shaped surface of said peripheral sheath of said device is extended on each side by cylindrical surfaces whose sections are respectively identical to the internal sections of the sheaths of said structure to be connected together.

4. The device as claimed in claim 3, wherein the central core of said tapered, coaxial device is fixed to the sheath by means of annular spacers.

5. The device as claimed in claim 4, wherein said spacers are disposed in the cylindrical extensions of said core and said peripheral sheath.

6. The device as claimed in claim 4, wherein at least one of these spacers may be housed in at least one groove, formed in the external periphery of said core or in the internal periphery of said peripheral sheath.

7. The device as claimed in claim 6, wherein said spacer is disposed in the vicinity of one end of said connection device, said groove is defined between a face of said peripheral sheath and an end-piece able to be assembled to said body and said core is made from at least two interlockable portions.

8. A connector for joining a first and second ultra-high frequency coaxial conductor of different diameters, wherein said coaxial conductors include a central core conductor and an outer concentric conductor, said connector comprising:

(a) a truncated, conical-central conductor having a first end of substantially the same dimension as the end of said first central coaxial conductor and a second of substantially the same dimension as the end of said second central coaxial conductor;

(b) an outer truncated conical conductor having a first end of substantially the same dimension as the end of said first outer concentric coaxial conductor and a second end having substantially the same dimension as the end of said second outer concentric coaxial conductor;

(c) wherein said conical inner conductor and said outer concentric conductor having a common apex and are disposed such that the peripheral edges of the first end of said outer conical conductor and the peripheral edge of the first end of the inner conical conductor are equally spaced from said apex; and (d) wherein the peripheral edge of said second end of said outer conical conductor and the peripheral edge of said second end of the outer conical conductor are equally spaced from said apex.

9. The connector of claim 8 wherein the inner wall of said outer conical connector forms an angle of about 15° C. at said apex.

10. The connector of claim 8 wherein said central conical conductor includes cylindrical extensions extending from said first and second ends, said extension having ends corresponding essentially to the dimensions of the inner conductors of said first and second coaxial conductors and wherein said outer conical connector includes cylindrical extensions extending from said first and second ends and having ends corresponding essentially to the dimensions of the outer conductor of said first and second coaxial conductors.

11. A connector for joining first and second ultra-high frequency coaxial conductors of different diameter, wherein said coaxial conductors include a central core conductor and an outer concentric conductor, said connector comprising:

(a) a central conductor having a first cylindrical end having a dimension corresponding essentially to said central core of the first coaxial conductor, a conical portion integral with said first cylindrical end, and a second cylindrical end integral with the conical portion and opposite to the first cylindrical end, said second cylindrical end having a dimension corresponding essentially to the central core of said second coaxial connector;

(b) an outer conductor having a first cylindrical end having a dimension corresponding essentially to said outer conductor of the first coaxial connector, an outer conical portion integral with said first cylindrical end, and a second cylindrical end integral with the outer conical portion and opposite to the first cylindrical end, said second cylindrical end having a dimension corresponding essentially to the outer conductor of said second coaxial connector;

(c) wherein said inner and outer conical portions have a common apex and are disposed such that the peripheral edge of the first cylindrical end of the central core and the peripheral edge of the first cylindrical end of the outer conductor are equidistant from said apex; and (d) wherein the peripheral edge of said second cylindrical end of said outer conductor and the peripheral edge of said second cylindrical end of the outer conductor are equidistant from said apex.

* * * * *